United States Patent
Jing

(10) Patent No.: US 9,902,613 B2
(45) Date of Patent: Feb. 27, 2018

(54) POSITIONING METHOD IN MICROPROCESSING PROCESS OF BULK SILICON

(71) Applicant: CSMC TECHNOLOGIES FAB1 CO., LTD., Jiangsu (CN)

(72) Inventor: Errong Jing, Jiangsu (CN)

(73) Assignee: CSMC Technologies Fab1 Co., Ltd., Wuxi New District, Jiangsu (CN)

( * ) Notice: Subject to any disclaimer, the term of this patent is extended or adjusted under 35 U.S.C. 154(b) by 0 days.

(21) Appl. No.: 15/315,640

(22) PCT Filed: Aug. 19, 2015

(86) PCT No.: PCT/CN2015/087528
§ 371 (c)(1),
(2) Date: Dec. 1, 2016

(87) PCT Pub. No.: WO2016/078452
PCT Pub. Date: May 26, 2016

(65) Prior Publication Data
US 2017/0113930 A1    Apr. 27, 2017

(30) Foreign Application Priority Data
Nov. 18, 2014   (CN) .......................... 2014 1 0660920

(51) Int. Cl.
*H01L 21/00* (2006.01)
*B81C 3/00* (2006.01)

(52) U.S. Cl.
CPC .................................. *B81C 3/004* (2013.01)

(58) Field of Classification Search
CPC .... G03F 9/7084; G03F 9/7088; G03F 9/7003; G03F 9/7011
See application file for complete search history.

(56) References Cited

U.S. PATENT DOCUMENTS

| 6,225,145 | B1 * | 5/2001 | Choi | B81C 1/00301 |
| | | | | 257/E21.582 |
| 7,253,884 | B2 * | 8/2007 | Van Buel | G03F 9/7003 |
| | | | | 355/52 |

(Continued)

FOREIGN PATENT DOCUMENTS

| CN | 101436006 | 5/2009 |
| CN | 101905856 | 12/2010 |

(Continued)

*Primary Examiner* — Jaehwan Oh
(74) *Attorney, Agent, or Firm* — Hamre, Schumann, Mueller & Larson, P.C.

(57) ABSTRACT

A positioning method in a microprocessing process of bulk silicon comprises the steps of: fabricating, on a first surface of a first substrate (10), a first pattern (100), a stepper photo-etching machine alignment mark (200) for positioning the first pattern, and a double-sided photo-etching machine first alignment mark (300) for positioning the stepper photo-etching machine alignment mark; fabricating, on a second surface, opposite to the first surface, of the first substrate, a double-sided photo-etching machine second alignment mark (400) corresponding to the double-sided photo-etching machine first alignment mark; bonding a second substrate (20) on the first surface of the first substrate; performing thinning on a first surface of the second substrate; fabricating, on the first surface of the second substrate, a double-sided photo-etching machine third alignment mark (500) corresponding to the double-sided photo-etching machine second alignment mark; and finding, on the first surface of the second substrate by using the double-sided photo-etching machine third alignment mark, a corresponding position of the stepper photo-etching machine alignment mark.

8 Claims, 3 Drawing Sheets

(56) References Cited

U.S. PATENT DOCUMENTS

| | | | |
|---|---|---|---|
| 7,528,937 B1* | 5/2009 | Crespin | G03F 7/70425 355/75 |
| 8,822,141 B1 | 9/2014 | Farooq et al. | |
| 2002/0081821 A1* | 6/2002 | Cabuz | B81C 1/0015 438/455 |
| 2002/0167649 A1* | 11/2002 | Heinle | G03B 27/42 355/53 |
| 2009/0152705 A1* | 6/2009 | Breng | B81C 1/00333 257/690 |
| 2014/0264909 A1* | 9/2014 | Liu | B81C 1/00301 257/774 |

FOREIGN PATENT DOCUMENTS

| | | |
|---|---|---|
| CN | 102556956 | 7/2012 |
| CN | 103558740 | 2/2014 |
| CN | 104078405 | 10/2014 |
| EP | 1 406 126 | 4/2004 |
| EP | 1 477 861 | 11/2004 |

\* cited by examiner

POSITIONING METHOD IN MICROPROCESSING PROCESS OF BULK SILICON

FIELD OF THE INVENTION

The present invention relates to a technical field of semiconductors, and more particularly relates to a positioning method in micromachining process for a bulk silicon.

BACKGROUND OF THE INVENTION

MEMS micromachining technology includes a micromachining process for a bulk silicon and a surface micromachining technology. A commonly used micromachining process for a bulk silicon is: first fabricating patterns (such as a deep channel) on one silicon wafer, and then bonding the silicon wafer to another one silicon wafer, performing a grinding to the bonded silicon wafer, and fabricating patterns on a surface of the bonded silicon wafer. The micromachining process for a bulk silicon can manufacture a monocrystalline silicon structure having a greater thickness, and is extensively applied to fields such as an acceleration sensor, a gyroscope, and a microscope. In order to guarantee an alignment between the patterns on surfaces of the upper silicon wafer and the lower silicon wafer, before bonding, it requires a double-sided lithography machine to fabricate pattern on the lower surface of the first silicon wafer, the pattern is aligned to the pattern on the upper surface. After being bonded to the second silicon wafer, it also requires the double-sided lithography machine to fabricate pattern on the upper surface on the second silicon wafer, the pattern is aligned to the pattern on the lower surface of the silicon wafer, such that the pattern on the upper surface of the second silicon wafer is indirectly aligned to the pattern on the upper surface of the first silicon wafer. The double-sided lithography machine adopts a proximity exposure and a contact exposure, i.e. adopts an optical system to project the pattern on the silicon wafer with the proportion of 1:1, it requires a mask having a dimension equal to that of the silicon wafer, the dimension and position of the pattern is required to be completely the same as that in practical situation. An alignment accuracy of the method is relative lower, the alignment accuracy generally is 2-3 micrometers. Because the double-sided lithography machine is adopted twice, the alignment accuracy between the patterns on the upper surface and the lower surface generally is 4-6 micrometers, the alignment accuracy is poor.

SUMMARY OF THE INVENTION

Accordingly, it is necessary to provide positioning method in micromachining process for a bulk silicon which can effectively enhance an alignment accuracy.

A positioning method in micromachining process for a bulk silicon includes: fabricating a first pattern, a stepper lithography machine alignment mark configured to position the first pattern, and a first alignment mark for a double-sided lithography machine configured to position the stepper lithography machine alignment mark on a first surface of a first substrate; fabricating a second alignment mark for a double-sided lithography machine corresponding to the first alignment mark for a double-sided lithography machine on a second surface of the first substrate opposite to the first surface; bonding a second substrate on the first surface of the first substrate; performing a grinding process to a first surface of the second substrate; fabricating a third alignment mark for a double-sided lithography machine corresponding to the second alignment mark for a double-sided lithography machine on the first surface of the second substrate; and finding a position corresponding to the stepper lithography machine alignment mark by the third alignment mark for a double-sided lithography machine on the first surface of the second substrate.

In aforementioned positioning method in micromachining process for a bulk silicon, a method combining the double-sided lithography to the stepper lithography is adopted, the stepper lithography machine alignment mark for the stepper lithography machine on the first substrate is found by the double-sided lithography machine, and then the second substrate is directly aligned by the stepper lithography machine. The alignment accuracy of the stepper lithography machine is equivalent to an alignment accuracy of the patterns on surfaces of the upper/lower substrate, such that the alignment accuracy of the micromachining process for a bulk silicon is improved greatly. The stepper lithography machine is an integrated optic-mechanical-electron system which gathers precision optics, precision mechanics and automatic controls, the alignment accuracy can be less than 0.5 micrometers, therefore, the alignment accuracy of the micromachining process for a bulk silicon can be less than 0.5 micrometers.

BRIEF DESCRIPTION OF THE DRAWINGS

In order to illustrate the technical solution of the invention or prior art more clearly, hereinafter, a brief introduction of accompanying drawings employed in the description of the embodiments or the prior art is provided. It is apparent that accompanying drawings described hereinafter merely are several embodiments of the invention. For one skilled in the art, other drawings can be obtained according to the accompanying drawings, without a creative work

DETAILED DESCRIPTION OF THE EMBODIMENTS

Embodiments of the invention are described more fully hereinafter with reference to the accompanying drawings, in which preferred embodiments of the invention are shown. The various embodiments of the invention may, however, be embodied in many different forms and should not be construed as limited to the embodiments set forth herein. Rather, these embodiments are provided so that this disclosure will be thorough and complete, and will fully convey the scope of the invention to those skilled in the art.

Unless otherwise defined, all terms (including technical and scientific terms) used herein have the same meaning as commonly understood by one of ordinary skill in the art to which this invention belongs. Terms in the description of the invention are for the purpose of describing specific embodiments, and are not intend to limit the invention. As used herein, the term "and/or" includes any and all combinations of one or more of the associated listed items.

Figure 1:
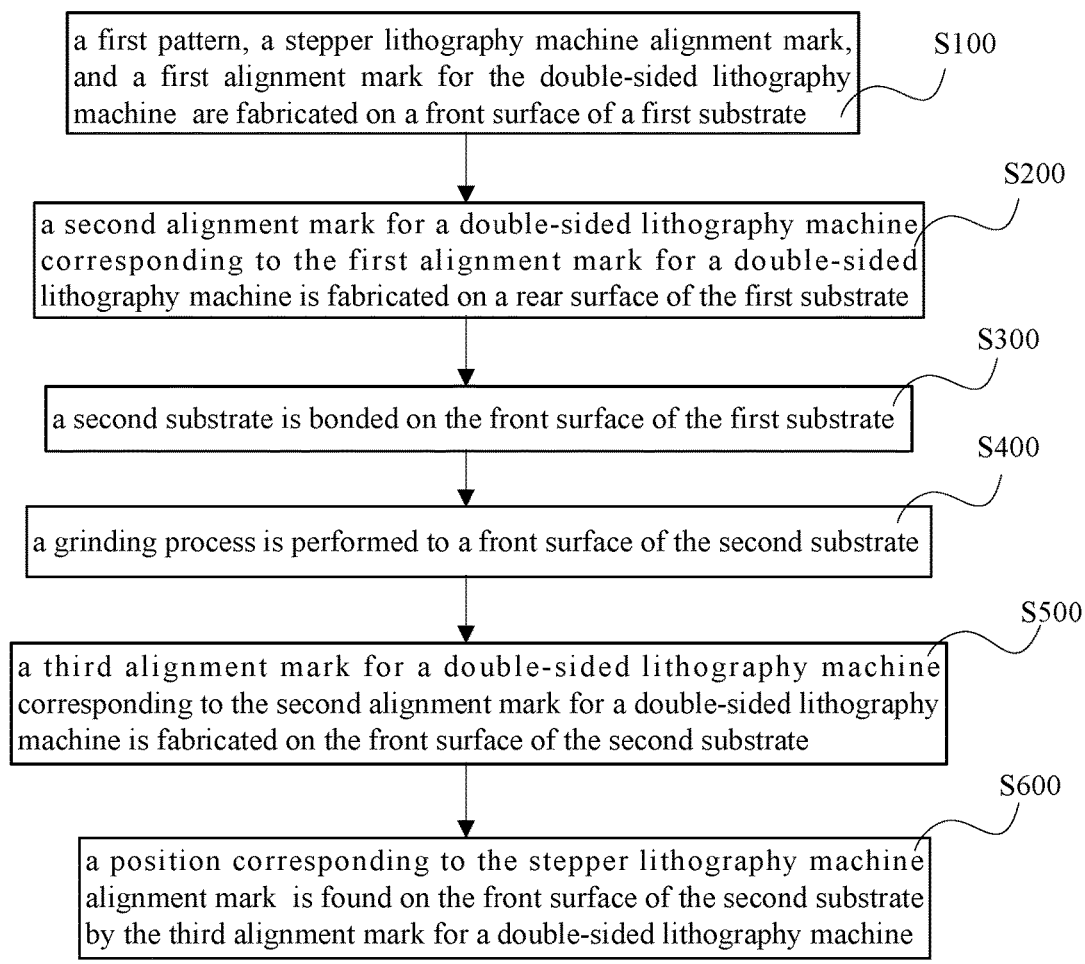
FIG. 1 is a flow chart of a position method in micromachining process for a bulk silicon according to an embodiment.

FIG. 1 is a flow chart of a position method in micromachining process for a bulk silicon according to an embodiment.

Figure 2:
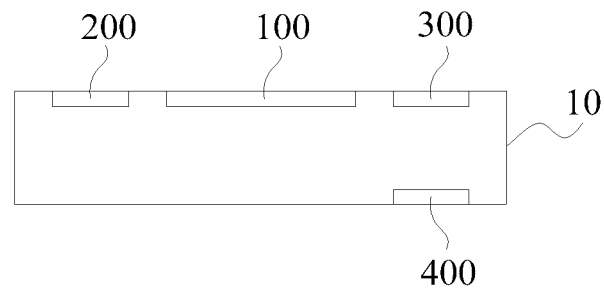
FIG. 2 is a perspective view of a first substrate after a second alignment mark for a double-sided lithography machine is fabricated.
Figure 3:
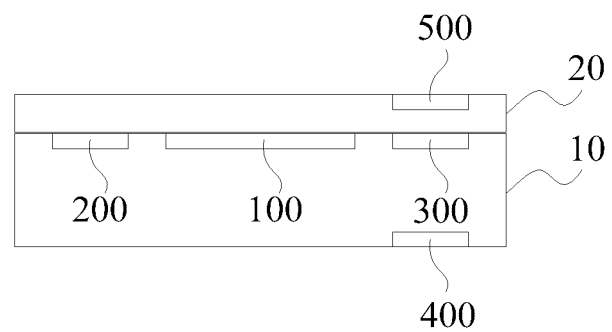
FIG. 3 is a perspective view of a second substrate after a third alignment mark for a double-sided lithography machine is fabricated.

Referring to FIG. 2 and FIG. 3, a positioning method in micromachining process for a bulk silicon includes steps as follows:

In step S100, a first pattern 100, a stepper lithography machine alignment mark 200 configured to position the first pattern 100, and a first alignment mark for a double-sided lithography machine 300 configured to position the stepper lithography machine alignment mark 200 are fabricated on a front surface of a first substrate 10. The first substrate 10 can be a silicon wafer. The first pattern 100 is fabricated, the stepper lithography machine alignment mark 200 which can position the first pattern 100 is fabricated, and the first alignment mark for a double-sided lithography machine 300 which can position the stepper lithography machine alignment mark 200 is fabricated, i.e. a position of the first pattern 100 can be determined by the stepper lithography machine alignment mark 200, a position of the stepper lithography machine alignment mark 200 can be determined by the first alignment mark for a double-sided lithography machine 300. The number of the stepper lithography machine alignment mark 200 should be multiple, and preferably, it is at least 5 to guarantee relative high alignment accuracy. The number of the first alignment marks for a double-sided lithography machine 300 is at least 2 to guarantee relative high alignment accuracy.

In step S200, a second alignment mark for a double-sided lithography machine 400 corresponding to the first alignment mark for a double-sided lithography machine 300 is fabricated on a rear surface of the first substrate 10. The "corresponding to" herein is "having a position corresponding to", i.e. a position of the first alignment mark for a double-sided lithography machine 300 on the front surface of the first substrate 10 is corresponding to a position of the second alignment mark for a double-sided lithography machine 400 on the rear surface. FIG. 2 is a perspective view of a first substrate after a second alignment mark for a double-sided lithography machine is fabricated.

In step S300, a second substrate 20 is bonded on the front surface of the first substrate 10. The second substrate 20 is made of material which is same as that of the first substrate 10, and the second substrate 20 is a silicon wafer.

In step S400, a grinding process is performed to the front surface of the second substrate 20. The grinding process is applied to the front surface to reach a required thickness of the device.

In step S500, a third alignment mark for a double-sided lithography machine 500 corresponding to the second alignment mark for a double-sided lithography machine 400 is fabricated on the front surface of the second substrate 20. The double-sided lithography machine is adopted to fabricate the third alignment mark for a double-sided lithography machine 500 corresponding to the second alignment mark for a double-sided lithography machine 400 on the front surface of the second substrate 20 by the second alignment mark for a double-sided lithography machine 400 on the rear surface of the first substrate 10. The "corresponding to" herein is "having a position corresponding to", i.e. the third alignment mark for a double-sided lithography machine 500 on the front surface of the second substrate 20 has a position corresponding to that of the second alignment mark for a double-sided lithography machine 400 on the rear surface of the first substrate 10. FIG. 3 is a perspective view of a second substrate after a third alignment mark for a double-sided lithography machine is fabricated.

In step S600, a position corresponding to the stepper lithography machine alignment mark 200 is found on a front surface of the second substrate 20 by the third alignment mark for a double-sided lithography machine 500. The specific principle is that, the position of the second alignment mark for a double-sided lithography machine 400 can be determined according to the third alignment mark for a double-sided lithography machine 500, and then the first alignment mark for a double-sided lithography machine 300 can be determined according to the second alignment mark for a double-sided lithography machine 400, and then the position of the stepper lithography machine alignment mark 200 can be determined according to the first alignment mark for a double-sided lithography machine 300.

The advantageous effect of the determination of the stepper lithography machine alignment mark 200 is that, the position of the first pattern 100 can be determined by the stepper lithography machine alignment mark 200 again in the following steps, such that a second pattern 700 corresponding to the position of the first pattern 100 can be fabricated. A method combining the double-sided lithography to the stepper lithography is adopted, the position of the stepper lithography machine alignment mark 200 of the stepper lithography machine on the first substrate is found by the double-sided lithography machine, and then an alignment is performed to the second substrate 20 directly by the stepper lithography machine. The alignment accuracy of the stepper lithography machine is equivalent to an alignment accuracy of the patterns (the first pattern 100 and the second pattern 700) on surfaces of the upper/lower substrate (the first substrate 10 and the second substrate 20), such that the alignment accuracy of the micromachining process for a bulk silicon is improved greatly. It is specifically illustrated with reference to the following embodiments.

Figure 5:
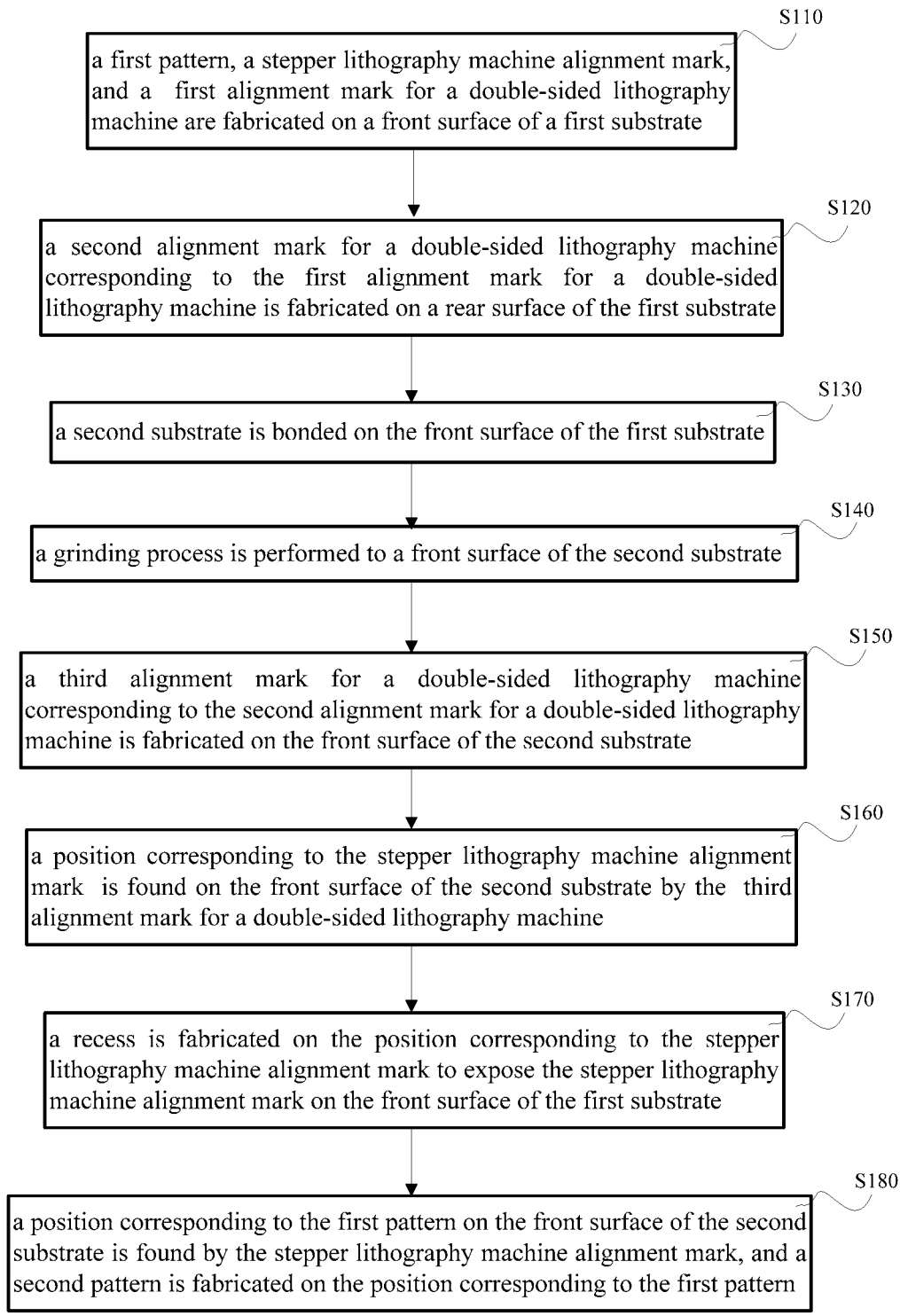
FIG. 5 is a flow chart of a position method in micromachining process for a bulk silicon according to another embodiment.

FIG. 5 is a flow chart of a position method in micromachining process for a bulk silicon according to another embodiment.

A positioning method in micromachining process for a bulk silicon includes steps as follows:

In step S110, a first pattern 100, a stepper lithography machine alignment mark 200 configured to position the first pattern 100, and a first alignment mark for a double-sided lithography machine 300 configured to position the stepper lithography machine alignment mark 200 are fabricated on a first surface (the front surface in the embodiment) of a first substrate 10. The first substrate 10 can be a silicon wafer. The first pattern 100 is fabricated, the stepper lithography machine alignment mark 200 which can position the first pattern 100 is fabricated, and the first alignment mark for a double-sided lithography machine 300 which can position the stepper lithography machine alignment mark 200 is fabricated, i.e. a position of the first pattern 100 can be determined merely by the stepper lithography machine alignment mark 200, a position of the stepper lithography machine alignment mark 200 can be determined by the first alignment mark for a double-sided lithography machine 300. The number of the stepper lithography machine alignment marks 200 should be multiple, and preferably, it is at least 5 to guarantee relative high alignment accuracy. The number of the first alignment mark for a double-sided lithography machine 300 is at least 2 to guarantee relative high alignment accuracy.

In step S120, a second alignment mark for a double-sided lithography machine 400 corresponding to the first alignment mark for a double-sided lithography machine 300 is fabricated on a second surface (the rear surface in the embodiment) of the first substrate 10. The "corresponding to" herein is "having a position corresponding to", i.e. a position of the first alignment mark for a double-sided lithography machine 300 on the front surface of the substrate 10 is corresponding to a position of the second alignment mark for a double-sided lithography machine 400 on the rear surface, as shown in FIG. 2.

In step S130, a second substrate 20 is bonded on the front surface of the first substrate 10. The second substrate 20 is made of material which is same as that of the first substrate 10, and the second substrate 20 is a silicon wafer.

In step S140, a grinding process is performed to a first surface (the front surface in the embodiment) of the second substrate 20.

In step S150, a third alignment mark for a double-sided lithography machine 500 corresponding to the second alignment mark for a double-sided lithography machine 400 is fabricated on the front surface of the second substrate 20. The double-sided lithography machine is adopted to fabricate the third alignment mark for a double-sided lithography machine 500 corresponding to the second alignment mark for a double-sided lithography machine 400 on the front surface of the second substrate 20 by virtue of the second alignment mark for a double-sided lithography machine 400 on the rear surface of the first substrate 10. The "corresponding to" herein is "having a position corresponding to", i.e. the third alignment mark for a double-sided lithography machine 500 on the front surface of the second substrate 20 has a position corresponding to that of the second alignment mark for a double-sided lithography machine 400 on the rear surface of the first substrate 10, as shown in FIG. 3.

In step S160, a position corresponding to the stepper lithography machine alignment mark 200 is found on the front surface of the second substrate 20 by the third alignment mark for a double-sided lithography machine 500. The specific principle is that, the position of the second alignment mark for a double-sided lithography machine 400 can be determined according to the third alignment mark for a double-sided lithography machine 500, and then the first alignment mark for a double-sided lithography machine 300 can be determined according to the second alignment mark for a double-sided lithography machine 400, and then the position of the stepper lithography machine alignment mark 200 can be determined according to the first alignment mark for a double-sided lithography machine 300

In step S170, a recess 600 is fabricated on the position corresponding to the stepper lithography machine alignment mark 200 on the front surface of the second substrate 20, to expose the stepper lithography machine alignment mark 200 on the front surface of the first substrate 10. A part of the substrate corresponding to stepper lithography machine alignment mark 200 on the front surface of the second substrate 20 is removed, the stepper lithography machine alignment mark 200 below the second substrate 20 is exposed. The removing method can be performed by using stepper lithography machine through etching technology, such as dry etching or wet etching.

Figure 4:
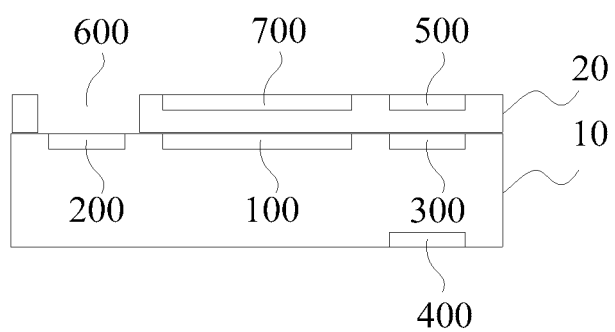
FIG. 4 is a perspective view of a second substrate after a recess and a first pattern are fabricated.

In step S180, a position corresponding to the first pattern 100 on the front surface of the second substrate 20 is found by the stepper lithography machine alignment mark 200, and a second pattern 700 is fabricated on the position corresponding to the first pattern 100. Because the position of the first pattern 100 can be determined by the stepper lithography machine alignment mark 200, therefore, the second pattern 700 fabricated on the second substrate 20 by the stepper lithography machine alignment mark 200 has a position corresponding to the first pattern 100 on the first substrate 10, an accurate alignment can be achieved. FIG. 4 is a perspective view of a second substrate after a recess and a first pattern is fabricated, referring to FIG. 4.

In aforementioned positioning method in micromachining process for a bulk silicon, a method combining the double-sided lithography to the stepper lithography is adopted, the stepper lithography machine alignment mark of the stepper lithography machine on the first substrate is found by the double-sided lithography machine, and then the second substrate is directly aligned by the stepper lithography machine. The alignment accuracy of the stepper lithography machine is equivalent to an alignment accuracy of the patterns on surfaces of the upper/lower substrate, such that the alignment accuracy of the micromachining process for a bulk silicon is improved greatly. The stepper lithography machine is an integrated optic-mechanical-electron system which gathers precision optics, precision mechanics and automatic controls, the alignment accuracy can be less than 0.5 micrometers, therefore, the alignment accuracy of the micromachining process for a bulk silicon can be less than 0.5 micrometers.

The above are several embodiments of the present invention described in detail, and should not be deemed as limitations to the scope of the present invention. It should be noted that variations and improvements will become apparent to those skilled in the art to which the present invention pertains without departing from its spirit and scope. Therefore, the scope of the present invention is defined by the appended claims.

What is claimed is:

1. A positioning method in micromachining process for bulk silicon, comprising:
    fabricating a first pattern, a stepper lithography machine alignment mark configured to position the first pattern, and a first alignment mark for a double-sided lithography machine configured to position the stepper lithography machine alignment mark on a first surface of a first substrate;
    fabricating a second alignment mark for the double-sided lithography machine corresponding to the first alignment mark for the double-sided lithography machine on a second surface of the first substrate opposite to the first surface;
    bonding a second substrate on the first surface of the first substrate;
    performing a grinding process to a first surface of the second substrate;
    fabricating a third alignment mark for the double-sided lithography machine corresponding to the second alignment mark for the double-sided lithography machine on the first surface of the second substrate; and
    finding a position corresponding to the stepper lithography machine alignment mark by the third alignment mark for the double-sided lithography machine on the first surface of the second substrate.

2. The method according to claim 1, further comprising:
    removing a part of the second substrate corresponding to the stepper lithography machine alignment mark, thereby exposing the stepper lithography machine alignment mark on the first surface of the first substrate.

3. The method according to claim 2, further comprising:
    finding a position corresponding to the first pattern on the first surface of the second substrate by the stepper lithography machine alignment mark, and fabricating a second pattern on the position corresponding to the first pattern.

4. The method according to claim 2, wherein the part of the second substrate on the position corresponding to the stepper lithography machine alignment mark is removed by etching technology.

5. The method according to claim 4, wherein removing the part of the second substrate on the position corresponding to the stepper lithography machine alignment mark comprises using a stepper lithography machine to perform lithography.

6. The method according to claim 1, wherein a number of the stepper lithography machine alignment marks is at least five.

7. The method according to claim 1, wherein a number of the first alignment marks of the double-sided lithography machine is at least two.

8. The method according to claim 1, wherein the first substrate and the second substrate are silicon wafers.

* * * * *